United States Patent [19]
Kimura

[11] Patent Number: 5,254,870
[45] Date of Patent: Oct. 19, 1993

[54] STATIC RANDOM ACCESS MEMORY HAVING MEMORY CELLS WITH ELECTRIC FIELD SHIELDING FOR CELL LOAD RESISTANCES

[75] Inventor: Masakazu Kimura, Suwa, Japan

[73] Assignee: Seiko Epson Corporation, Tokyo, Japan

[21] Appl. No.: 821,250

[22] Filed: Jan. 10, 1992

Related U.S. Application Data

[63] Continuation of Ser. No. 457,798, Feb. 14, 1990, abandoned.

[30] Foreign Application Priority Data

| May 7, 1988 | [JP] | Japan | 63-111032 |
| May 11, 1988 | [JP] | Japan | 63-115231 |
| Oct. 21, 1988 | [JP] | Japan | 63-265303 |
| Dec. 7, 1988 | [JP] | Japan | 63-309127 |
| Dec. 7, 1988 | [JP] | Japan | 63-309128 |

[51] Int. Cl.⁵ .................... H01L 29/68; H01L 29/78
[52] U.S. Cl. .................... 257/659; 257/314; 257/380; 365/154; 365/53
[58] Field of Search ........... 357/23.5, 41, 51, 59 F, 357/59 I, 59 J, 71; 365/154, 156, 182, 53; 257/314, 315, 379, 380

[56] References Cited

U.S. PATENT DOCUMENTS

| 4,455,567 | 6/1984 | Lee et al. | 357/59 F |
| 4,679,171 | 7/1987 | Logwood et al. | 365/154 |
| 4,841,481 | 6/1989 | Ikeda et al. | 357/41 |
| 4,849,801 | 7/1989 | Honjyo et al. | 357/41 |
| 4,853,894 | 8/1989 | Yamanaka et al. | 365/53 |
| 4,907,057 | 3/1990 | Ariizumi et al. | 357/41 |
| 4,984,200 | 1/1991 | Saitoo et al. | 365/154 |

FOREIGN PATENT DOCUMENTS

| 0087979 | 9/1983 | European Pat. Off. |
| 0173245 | 3/1986 | European Pat. Off. |
| 61-283161 | 12/1986 | Japan | 357/59 F |
| 112362 | 5/1987 | Japan |
| 62-169472 | 7/1987 | Japan | 357/59 F |
| 016658 | 1/1988 | Japan |

*Primary Examiner*—Rolf Hille
*Assistant Examiner*—Minhloan Tran
*Attorney, Agent, or Firm*—W. Douglas Carothers, Jr.

[57] ABSTRACT

A static random access memory integrated circuit comprises a plurality of memory cells that contain load resistance elements formed as load resistance strips in proximity of active and passive components of the integrated circuit. A conductive layer formed between the load resistance strips and such components functions as a shield to protect the load resistance strips of a memory cell from the effects of electric fields established from operation of such components, such as, MOS transistors underlying the load resistance strips between which the shield is formed. With the load resistance strips protected by the presence of the shield, their resistance values will not vary or be effected by imposing electric fields from the operation of the MOS transistors. Shield protection of the load resistance values by this shielding permits a corresponding thinning of thickness of the load resistance strips to increase their resistance value thereby permitting a reduction in the length of these strips while maintaining their necessary high resistance values for operation of the memory cell, which reduces the consumption current, $I_{DD}$, as well as the overall size of the memory cell so that the total density of the static memory device is effectively increased.

5 Claims, 7 Drawing Sheets

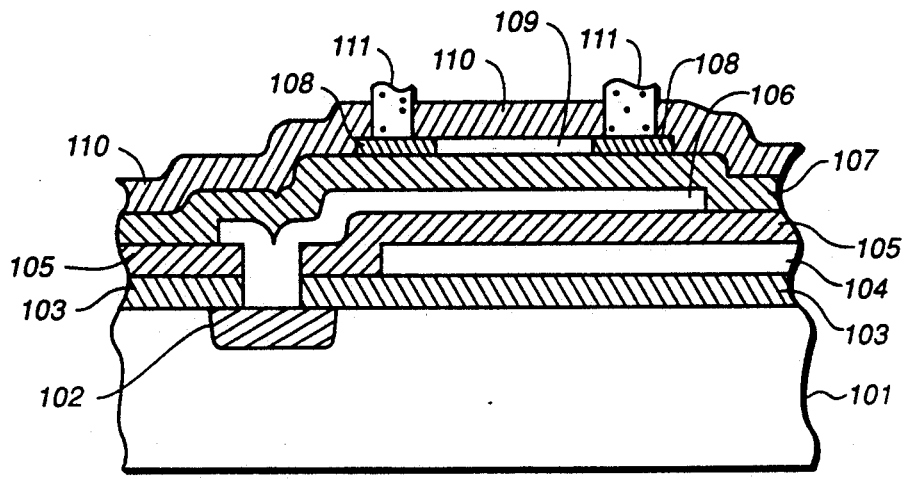
FIG._1
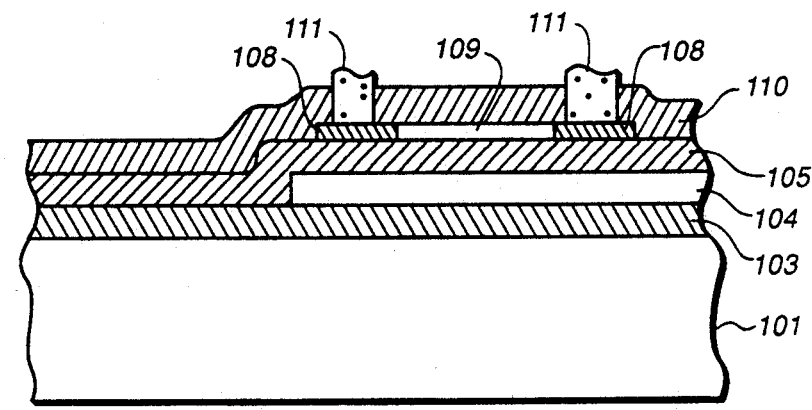
FIG._2
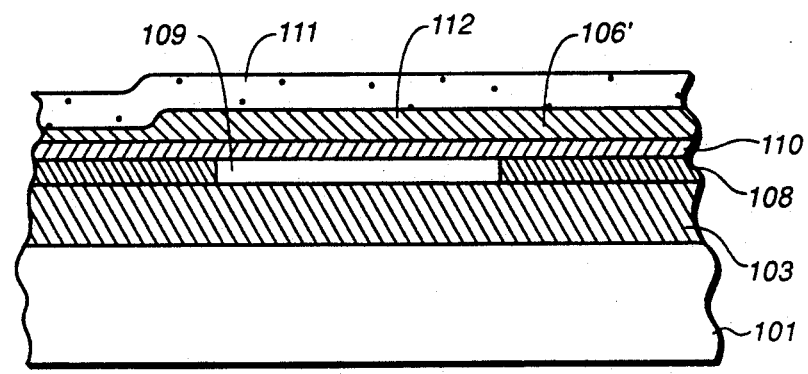
FIG._8

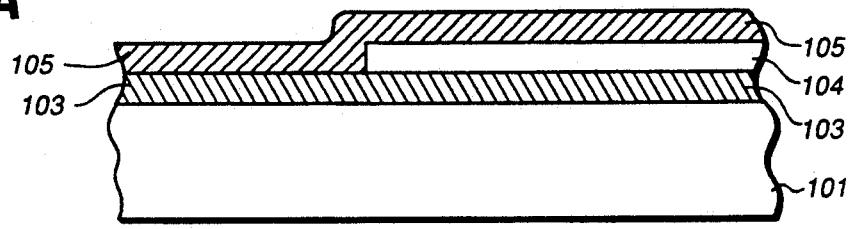
FIG._3A
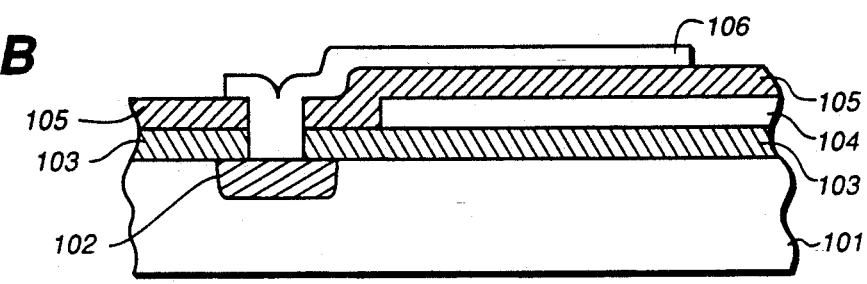
FIG._3B
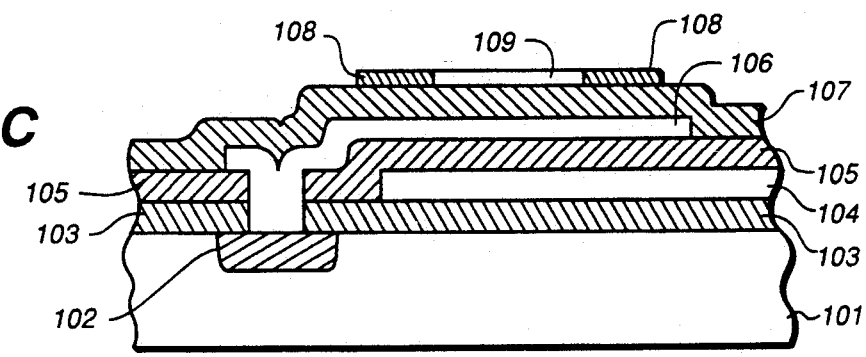
FIG._3C
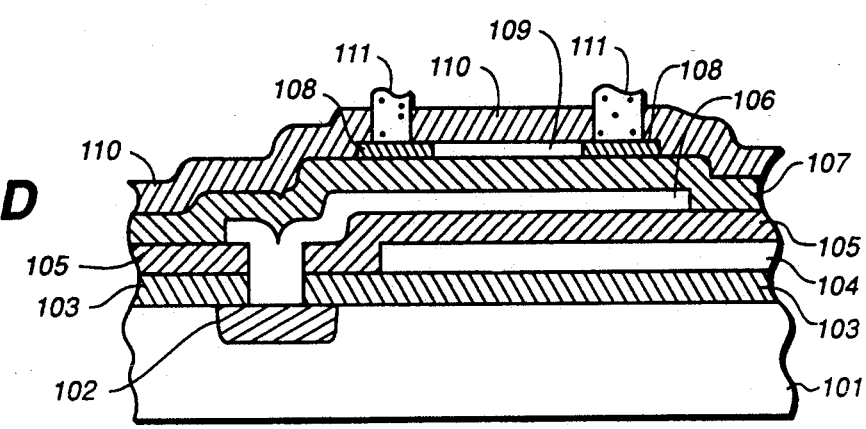
FIG._3D

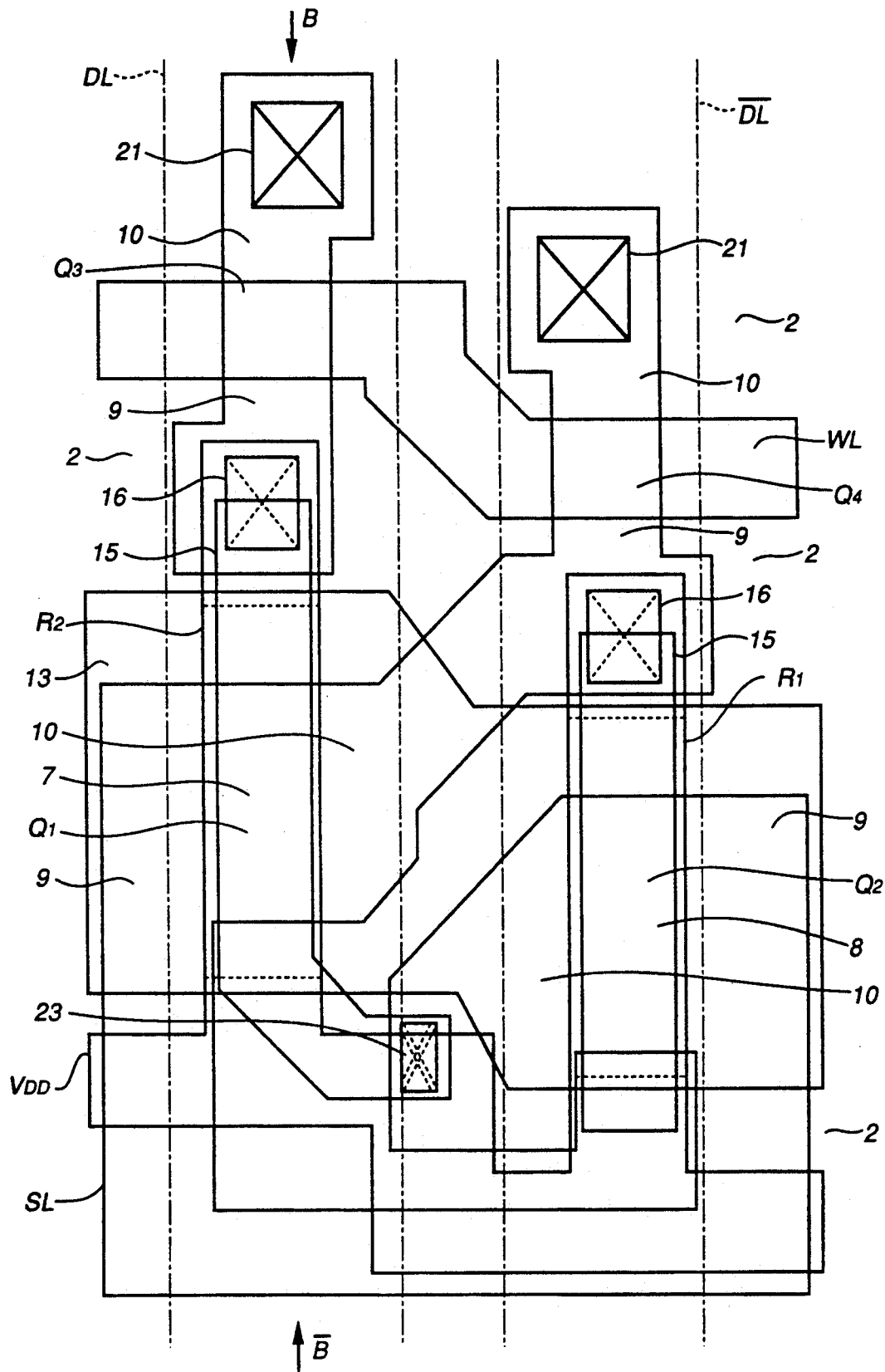
FIG._4A

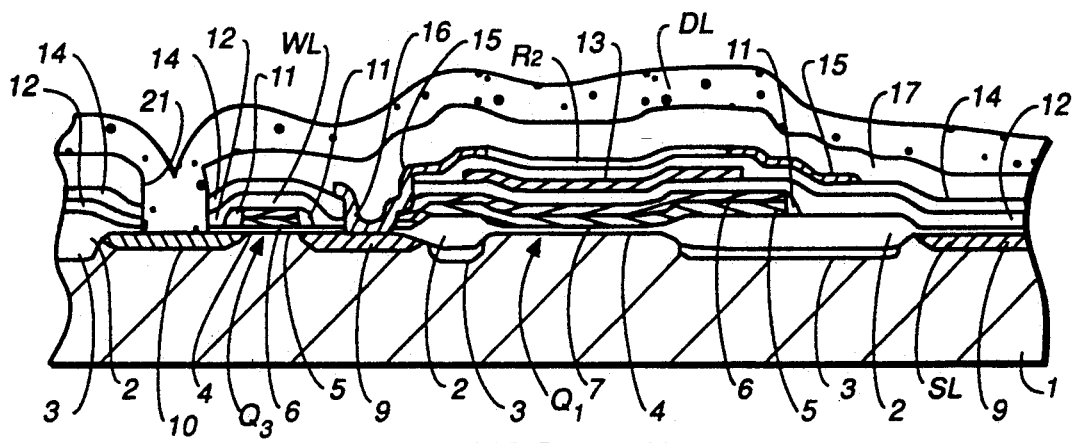
FIG._4B
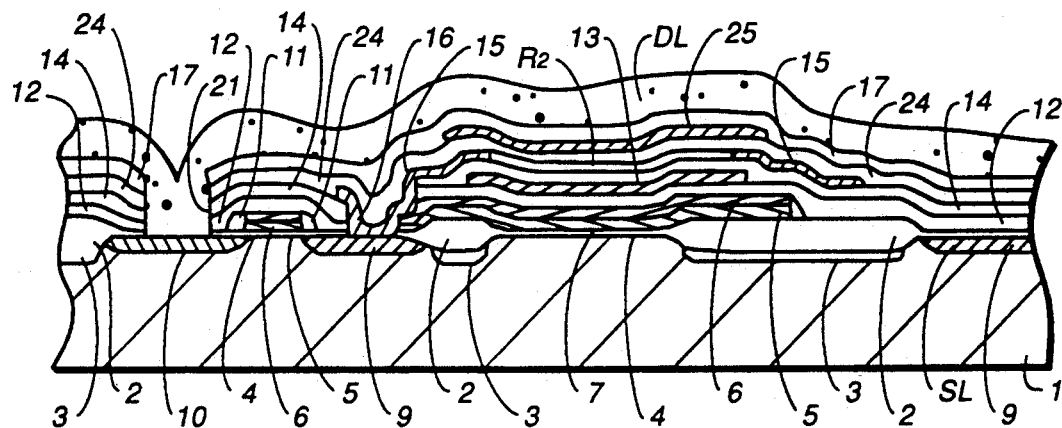
FIG._9
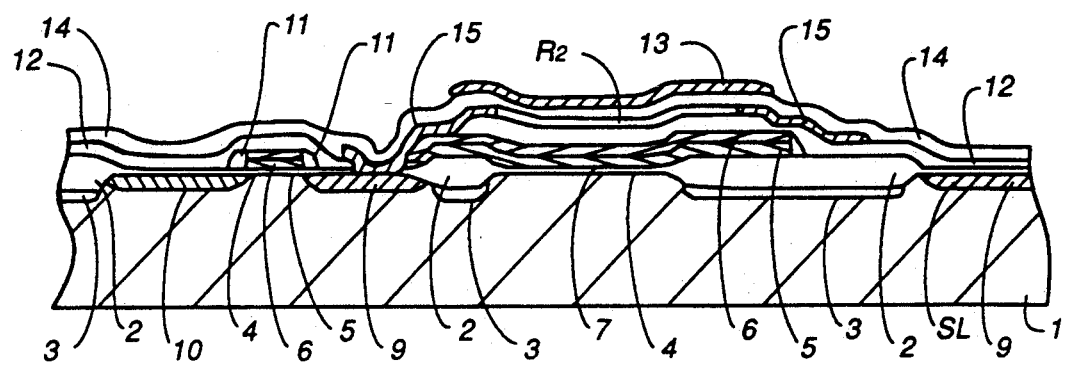
FIG._10

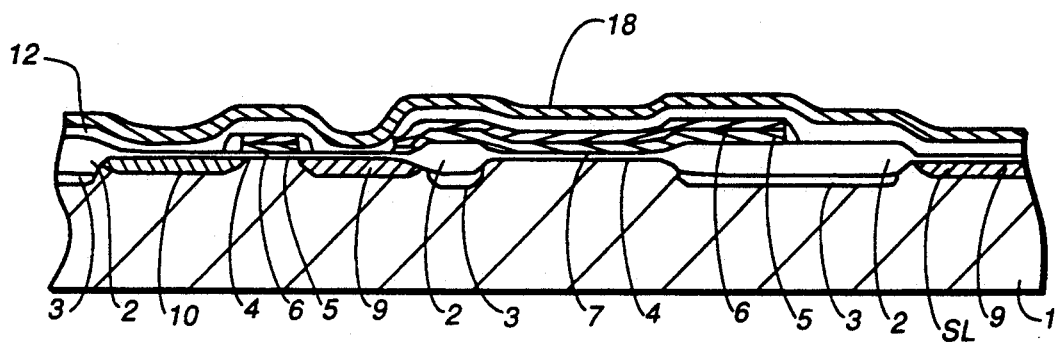
FIG._5A
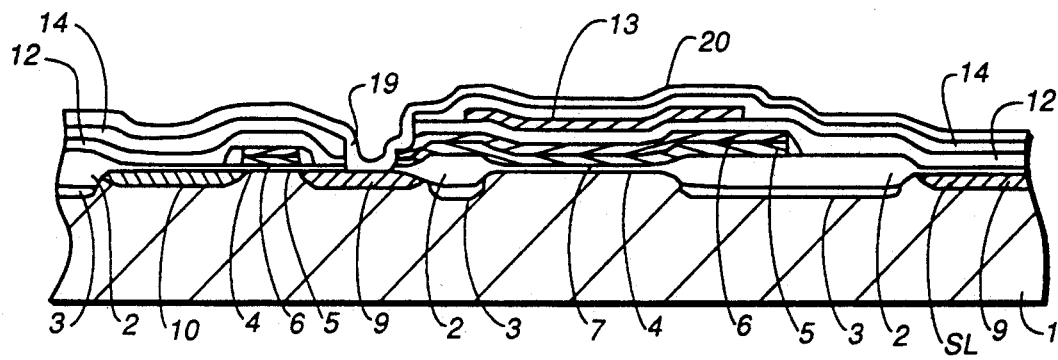
FIG._5B
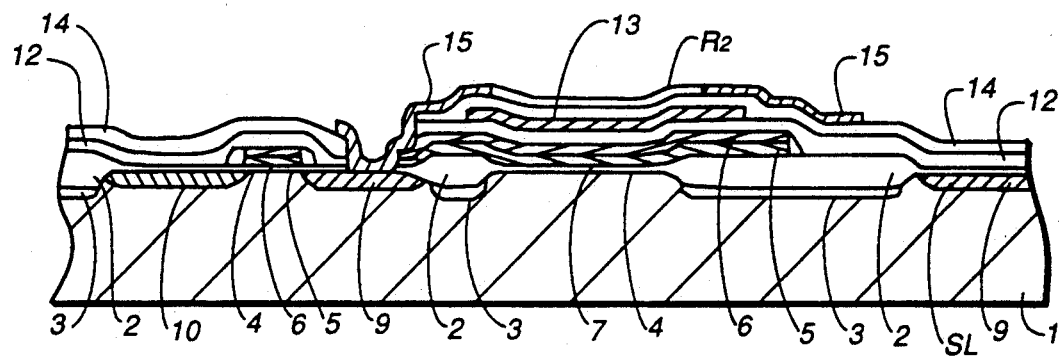
FIG._5C

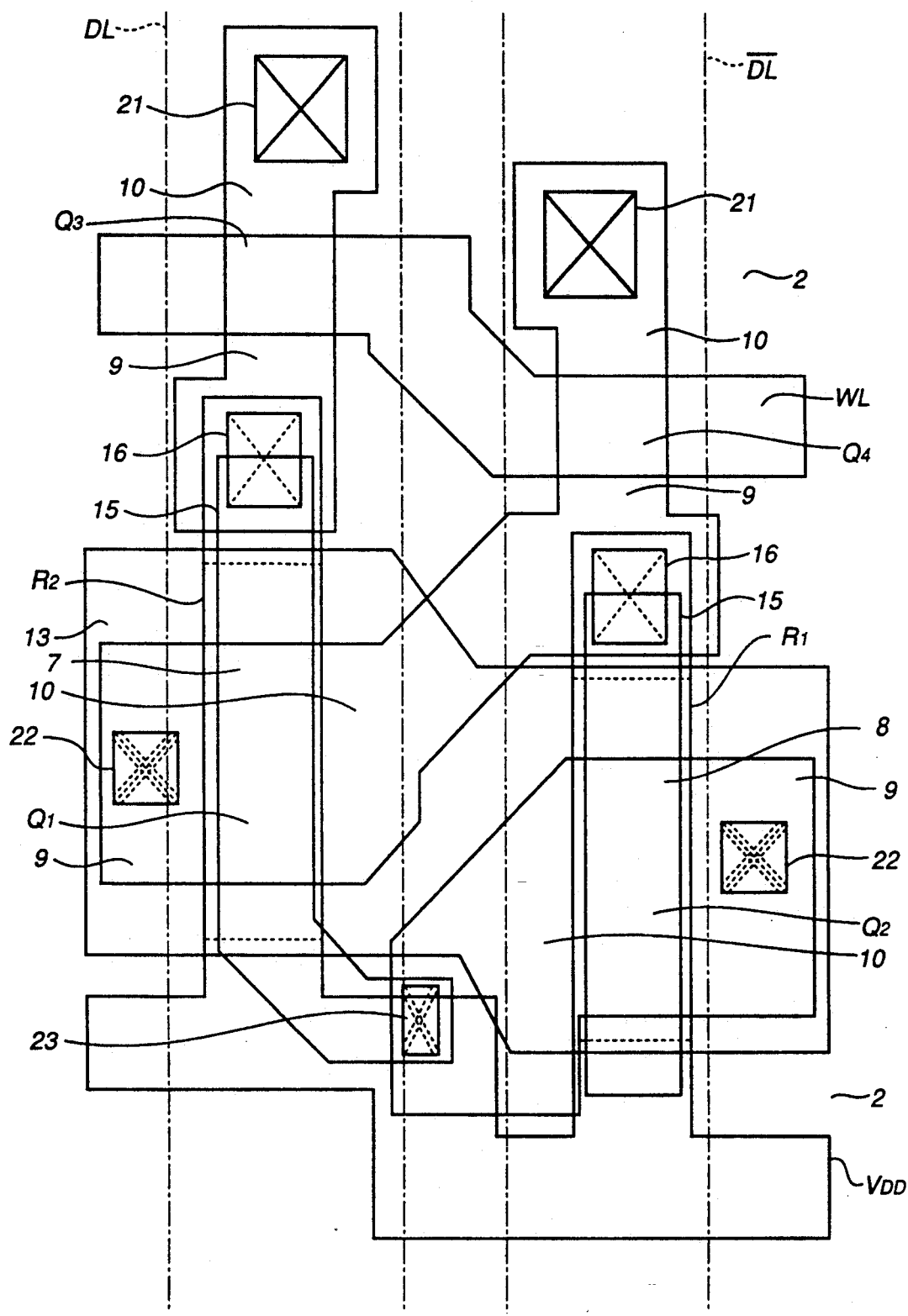
FIG._6

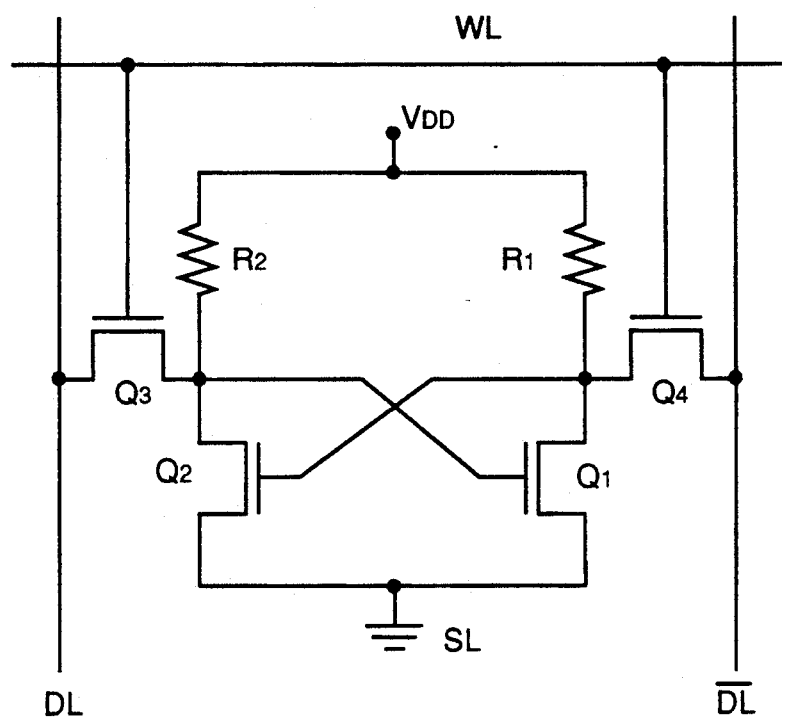
FIG._7
*(prior art)*

STATIC RANDOM ACCESS MEMORY HAVING MEMORY CELLS WITH ELECTRIC FIELD SHIELDING FOR CELL LOAD RESISTANCES

This is a continuation of copending application Ser. No. 07/457,798 filed Feb. 14, 1990 now abandoned.

TECHNICAL FIELD

The present invention is generally directed to a shield structure for a resistance element of a semiconductor device, such as a static RAM (Random Access Memory), and more particularly, to effective techniques for shielding the resistance element from electric field exposure.

BACKGROUND ART

In the sector of integrated circuits, techniques associated with utilization of resistance elements in such circuits become more and more important as the integration thereof is improved.

A resistance element structure of a prior art semiconductor device is that, as illustrated in FIG. 2, a low resistance region 108, serving as a wiring, into which impurities such as phosphorus and boron are implanted and a high resistance region 109 containing no or a slight amount of impurities are formed together with an element (e.g., a wiring) 104 thereunder, with only an insulating film being sandwiched therebetween.

A dominant memory cell of a conventional static RAM may be a high resistance polycrystalline silicon load type memory cell (e.g., Japanese Patent Laid-Open Publication No. 57-130461). As depicted in FIG. 7, the high resistance polycrystalline silicon load type memory cell incorporates a flip-flop for storing information, the arrangement being such that one inverter is composed of a MOSFET $Q_1$ and a high resistance polycrystalline silicon resistance (high resistance region) $R_1$, the other inverter is composed of a MOSFET $Q_2$ and a high resistance polycrystalline silicon resistance (high resistance region) $R_2$, and an output of one inverter is connected to an input of the other inverter. The flip-flop is combined with switching MOSFETs $Q_3$ and $Q_4$ for transferring or receiving pieces information to or from a unit outside the cell. A power supply $V_{DD}$ is connected to one end of each of the high resistance polycrystalline silicon resistances $R_1$ and $R_2$, while sources of the MOSFETs $Q_1$ and $Q_2$ are respectively connected to ground. A word line WL is connected to gates of the switching MOSFETs $Q_3$ and $Q_4$, while data lines DL and $\overline{DL}$ are connected to the drains thereof.

The high resistance polycrystalline silicon resistances $R_1$ and $R_2$ are formed, for instance, in the following manner. Formed on a semiconductor substrate are the MOSFETs $Q_1$ through $Q_4$ in which a first layer, i.e., a polycide film serves as a gate. Subsequently, an inter-layer insulating film is formed, and thereafter a non-doped, viz., intrinsic polycrystalline silicon film is formed over a surface of this inter-layer insulating film. A surface of a region including a portion which will hereinafter become a high resistance polycrystalline silicon resistance (high resistance region) in the intrinsic polycrystalline silicon film is covered with a mask layer by which the phosphorous is diffused into the polycrystalline silicon film, or alternatively ion implantation is effected thereinto. The resistance is thus reduced in value. The next process is to eliminate the mask layer, and the polycrystalline silicon film undergoes patterning to assume a predetermined configuration, thereby forming a wiring consisting of an N+ type polycrystalline silicon film exhibiting a low resistivity due to the introduction of phosphorus and also high resistance polycrystalline silicon resistances $R_1$ and $R_2$ each consisting of an intrinsic polycrystalline silicon film.

However, the following problems inherent in the foregoing conventional techniques arise. There will now be made some examinations about an increase and a decrease in a consumption current $I_{DDS}$ (flowing from the power supply $V_{DD}$ to a ground conductor via $R_1$ or $R_2$ during a so-called standby period) during the standby period (standby current) in the static RAM including the above-described high resistance polycrystalline silicon load type memory cell.

In the case of, e.g., a 256KSRAM or a 1MSRAM, the consumption current $I_{DDS}$ is typically some 1 $\mu$A, and a potential difference between $V_{DD}$ and $V_{SS}$ is approximately 5 V.

Reducing the consumption current $I_{DD}$ may merely require a step of decreasing a film thickness of each of the high resistance polycrystalline silicon resistance $R_1$ and $R_2$. This implies that resistance values of the resistances $R_1$ and $R_2$ increase. The resistances, however, tend to receive an influence of an electric field of the element disposed thereunder as the film thickness is reduced. Thus, a so-called polycrystalline silicon thin film transistor structure is developed, wherein the wiring layer serves as source and drain regions, the high resistance polycrystalline silicon resistances $R_1$ and $R_2$ are conceived as substrates, and the element provided there beneath is a gate electrode. It therefore follows that the resistance values of the high resistance polycrystalline silicon resistances $R_1$ and $R_2$ vary (referred to as a TET effect) depending on a state of the electric field of the element thereunder. This approach is a technique disclosed in Jpn. J. Appl. Phys. 23 (1984) L819 and 24 (1985) L4345, written by Hayashi, Noguchi and Ohshima.

Hence, it is difficult to manufacture a thin film silicon resistance element having a high resistance value with stability on the basis of the conventional techniques. This difficulty in turn causes such a problem that a high resistance polycrystalline silicon load type static RAM exhibiting characteristics of a low and stable consumption current $I_{DDS}$ is hard to be manufactured.

Accordingly, it is a primary object of the present invention, which is devised to obviate the foregoing problems, to provide a thin film silicon resistance element having a stable resistance value, and further a structure of a static RAM having a low and stable consumption current $I_{DDS}$.

DISCLOSURE OF THE INVENTION

A semiconductor device of the present invention is characterized by comprising: a first insulating film formed on a semiconductor substrate; a conductive layer formed on the first insulating film and connected to a constant potential; a second insulating film formed on the conductive layer; and a polycrystalline or monocrystalline silicon film including a low resistance region serving as a wiring and a high resistance region conceived as a resistor having a resistance value of 100 G$\Omega$ to 5 T$\Omega$.

A semiconductor device of the invention is further characterized by comprising: a first insulating film formed on a semiconductor substrate; a polycrystalline or monocrystalline silicon film formed on the first insulating film and including a low resistance region serving as a wiring and a high resistance region defined as a resistor having a resistance value of 100 GΩ to 5 TΩ; a second insulating film formed on the silicon film; and a conductive layer formed on the second insulating film and connected to a constant potential.

In a semiconductor device including a high resistance polycrystalline silicon load type memory cell wherein a high resistance polycrystalline silicon resistance having a resistance value of 100 GΩ to 5 TΩ is connected to a wiring layer, the improvement according to the present invention is characterized by comprising a conductive layer connected to a constant source potential and is formed between insulating films above and/or below the region of the high resistance polycrystalline silicon resistance.

Based on the constructions given above, a resistance element made of polycrystalline silicon constituting the high resistance region is subjected to no influence of electric fields of active and passive elements above or under the resistance element. It is therefore possible, as advantages of the invention, to obtain a remarkably stable and reliable semiconductor device and also a semiconductor memory exhibiting characteristics of a low and stable consumption current $I_{DDS}$.

BRIEF DESCRIPTION OF THE DRAWINGS

FIG. 1 is a principal sectional view depicting one embodiment of a semiconductor device according to the present invention;

FIG. 2 is a sectional view illustrating a prior art semiconductor device;

FIGS. 3(A) through 3(D) are principal sectional views of assistance in explaining the steps of manufacturing the semiconductor device of the present invention;

FIG. 4(A) is a principal plan view illustrating one embodiment of a semiconductor memory of the invention;

FIG. 4(B) is a sectional view taken substantially along the line B-B̄, showing one embodiment of the semiconductor memory thereof;

FIGS. 5(A) through 5(C) are principal sectional views of assistance in explaining the steps in sequence as one example of a method of manufacturing the semiconductor memory of the invention which is depicted in FIGS. 4(A) and 4(B);

FIG. 6 is a principal plan view showing a variant form of the semiconductor memory of the invention;

FIG. 7 is a circuit diagram depicting a circuitry of a high resistance polycrystalline silicon load type memory cell;

FIG. 8 is a principal sectional view showing an embodiment of the semiconductor device of the invention;

FIG. 9 is a principal sectional view showing another embodiment of the semiconductor memory of the invention; and FIG. 10 is a principal sectional view showing still another embodiment of the semiconductor memory of the invention.

BEST MODE FOR CARRYING OUT THE INVENTION

A high resistance stated in embodiments of the present invention is a value of 100 GΩ or more, viz., approximately 100 G (giaga)Ω to 5 T (tera)Ω. A potential difference between $V_{DD}$ and $V_{SS}$ in a 256KSRAM or a 1MSRAM is typically 5 V, and a standby consumption current $I_{DDS}$ is preferably 1 μA or thereabouts. For this reason, a resistance value of a resistance composed of high resistance polycrystalline silicon or the like in the 256KSRAM is desirably 1 TΩ, while that in the 1MSRAM is desirably 5 TΩ. A resistance value of a resistance in a 64KSRAM desirably falls within a range of 100 GΩ to 3000 GΩ.

Turning first to FIG. 1, there is illustrated a sectional view of a semiconductor device in one embodiment according to the present invention. The reference numeral 101 represents a substrate; 102 an impurity diffused region of the substrate; 103 a first insulating film for separating the substrate from an element disposed thereunder; 104 the bottom element, i.e., a wiring in the embodiments of the invention; 105 a second insulating film; 106 a conductive layer composed of polycrystalline silicon; 107 a third insulating film; 108 a low resistance region (wiring) of a low resistance element; 109 a high resistance region representing resistor $R_1$ or $R_2$; 110 a fourth insulating film; and 111 an aluminum wiring for connecting the resistance element to other elements. The impurity diffused region is connected to ground.

The present invention will hereinafter be described in detail on the basis of the manufacturing steps with reference to FIGS. 3(A) to 3(D).

As illustrated in FIG. 3(A), the wiring 104 is formed via the first insulating film 103 on the substrate 101. A second insulating film 105 is formed on the wiring 104 as well as on the first insulating film 103. Substrate 101 is connected to ground.

Next, as depicted in FIG. 3(B), a contact hole is formed for connection to the substrate 101. A resist is formed on a portion of film 105 other than the portion wherein the contact hole is to be formed. Subsequently, immersion in a diluted hydrofluoric acid liquid is effected, and the first and second insulating films 103 and 105 are selectively removed by etching. Then, impurity ions are implanted through the contact hole to form region to reduce contact resistance. There are implanted impurities, having the same conductivity as that of the substrate 101, which may be phosphorus or arsenic if the substrate 101 is of an N-type and boron if classified as a P-type. As an example of implanted impurity an adequate acceleration energy is 60 KeV, and a proper dose is $6 \times 10^{15}$ cm$^{-2}$. Preparatory to formation of the conductive layer 106, a first polycrystalline silicon layer is formed having a thickness of 4000 Å. As a general practice, a monosilane gas is thermally decomposed at 620° C., and the conductive layer 106 formed of the first polycrystalline silicon layer is deposited on the second insulating film 105. As shown in FIG. 3B, film 105 is made conductive by implantation of impurities by means of ion implantation. The impurities are, as in the previous case, made to exhibit the same conductivity as that of the substrate 101. Implantation with a dose of preferably $5 \times 10^{15}$ cm$^{-2}$ is effected to considerably reduce the resistance value. Unnecessary portions of the conductive layer 106 are removed by photoetching.

As depicted in FIG. 3(C), a silicon oxide film (the third insulating film 107) of 2000 Å is formed on the conductive layer 106 by chemical vapor growth. With a view to forming a resistance element, a second polycrystalline silicon layer is shaped in the manner identical with that in the previous case. A film thickness corresponds to a resistance value required. The second polycrystalline silicon layer into which normally no impurity is implanted is employed as the high resistance region 109. In this case, even if the impurities are more or less introduced thereinto, the high resistance region can be obtained. Formed on the high resistance region 109 is a resist which in turn serves as a mask when second impurity ions are implanted to shape the low resistance region 108. In this case, the impurities like phosphorus are implanted properly under such conditions that a dose is $4 \times 10^{15}$ cm$^{-2}$, and an energy is 30 KeV. Thereafter, the resist is eliminated, and portions unnecessary for the resistance element are removed by effecting a photoetching process.

The fourth insulating film 110 is, as illustrated in FIG. 3(D), formed to have a thickness of 3000 Å in the manner identical with that of the third insulating film 107. To activate the impurities, annealing is effected in a nitrogen atmosphere for 20 minutes at 950° C. Finally, an aluminum wiring 111 is provided for connection with other elements. Contact holes are formed in portions of the fourth insulating film 110 disposed on the low resistance region 108 by means of photoetching. The aluminum layer 111 of a thickness of 1 μm is formed by sputtering. In the wake of this step, unnecessary portions of the aluminum layer 111 are removed by photoetching, whereby the resistance element depicted in FIG. 3(D) in this embodiment is completely manufactured. The embodiment of the invention has dealt with a case where the substrate 101 is connected to ground. The substrate 101 may, however, be connected to an impurity diffusing layer formed thereon having a conductivity level different from that of the grounded substrate. Moreover, the conductive layer 106 may be connected directly to an external ground terminal, i.e., to a constant potential such as $V_{DD}$ and $V_{SS}$. In this embodiment, the polycrystalline silicon resistance element has been stated so far, but a monocrystalline silicon resistance element monocrystallized by laser-annealing the polycrystalline silicon may be employed. In accordance with the embodiment of the invention, the conductive layer has been indicated as connected to ground but may also be connected to a constant voltage source. In such a case also, the resistance value will be stabilized.

The embodiment of the invention has been described as employing a polycrystalline silicon layer serving as the conductive layer 106 into which impurities are implanted. Layer 106 may also be aluminum and other refractory metals such as molybdenum (mo), titanium (Ti) and tungsten (W). In addition, refractory metal silicides of the above-mentioned, which include $MoSi_2$, $TiSi_2$, $WSi_2$ and the like, may also be employed. In particular, the materials for layer 106 are not limited to the silicon and metals but may be anything of a conductive nature. This is also true for other embodiments herein.

Disposed on the high resistance region 109 may be a second conductive layer 106, best seen in FIG. 8, which is biased at a constant-voltage on insulating film 110 so that there is no influence from an electric field of any active element disposed or formed on the high resistance region. As a result, the resistance element is more stabilized.

Conductive layers may be provided upwardly and downwardly of the resistance element through the insulating films.

It should be noted that it is not necessary that the conductive layers be disposed under or above all the high resistance regions 109.

FIG. 4(A) is a plan view showing an embodiment in which the present invention is applied to a semiconductor memory. FIG. 4(B) is a sectional view taken substantially along the line B-$\overline{B}^2$ of FIG. 4(A).

Throughout the drawings in the embodiments of the invention, the components having the same functions are identified by the like symbols, and the repetitive descriptions thereof are omitted herein. A memory cell of the static RAM in this embodiment of FIG. 4 has a circuitry similar to that shown in FIG. 7.

The static RAM in this embodiment requires separation of an element by use of a field insulating film 2 like, e.g., an $SiO_2$ film formed on the surface of the semiconductor substrate 1, such as, a P-type silicon substrate. Provided beneath the field insulating film 2 is a P-type channel stopper region 3, thereby preventing generation of a parasitic channel.

Gate insulating films 4 like, for instance, an $SiO_2$ film are deposited on individual surfaces of active regions surrounded by the field insulating films 2. Provided on the gate insulating film 4 and on the field insulating film 2 are a word line WL, gate electrodes 7 and 8 and ground conductor (source line) SL each composed of a polycide film, viz., a double-layered film consisting of, e.g., a polycrystalline silicon film 5 and a refractory metal silicide film 6 of Mo, Ti and W containing Si. An N-type source region 9 and drain region 10 are formed in the respective active regions defined by the field insulating films 2 in a self-matching manner with respect to the word line WL, the gate electrodes 7 and 8 and ground conductor SL. The word line WL, the source region 9 and the drain region 10 are combined to constitute switching MOSFETs $Q_3$ and $Q_4$. The gate electrode 7, the drain region 10 and the source region 9 are combined to form a MOSFET $Q_1$. The gate electrode 8, the source region 9 and the drain region 10 cooperate to constitute a MOSFET $Q_2$. The drain region 10 of the MOSFET $Q_1$ is common to the source region 9 of the MOSFET $Q_4$. These MOSFETs $Q_1$ to $Q_4$ are all based on a so-called LDD (Lightly Doped Drain) structure. The source region 9 and the drain region 10 are formed by implanting the impurities into the semiconductor substrate 1, which involves two steps, i.e., a pre-step and a post-step, of forming side wall insulating films 11 each composed of, e.g., $SiO_2$ on side surfaces of the gate electrodes 7 and 8 and the word line WL.

Formed on the MOSFETs $Q_1$ through $Q_4$ are interlayer insulating films 12, like an $SiO_2$ film, on which is disposed a conductive layer 13, composed of a polycrystalline silicon film with implanted impurities of high concentration, which is grounded or connected to a constant potential source to shield the electric fields of the gate electrodes 7 and 8. The conductive layer 13 is connected to, for example, $V_{DD}$ or $V_{SS}$. Provided on the conductive layer 13 is a second interlayer insulating film 14, like an $SiO_2$ film, on which to dispose a wiring layer 15 formed of an N$^+$ type polycrystalline silicon film assuming a predetermined configuration and high resistance polycrystalline silicon resistances $R_1$ and $R_2$ each consisting of an intrinsic polycrystalline silicon film and connected to the wiring layer 15. The wiring layer 15 is placed in contact with the source regions 9 of the MOSFETs $Q_3$ and $Q_4$ via the contact holes 16 formed in the gate insulating film 4, the second interlayer insulating film 14 and the inter-layer insulating film 12.

In this manner, the polycrystalline silicon film 13 into which the impurities are implanted with a high concentration are formed under the high resistance polycrystalline silicon resistances $R_1$ and $R_2$ through the second interlayer insulating film 14 so resistances $R_1$ and $R_2$ are not affected by any influence of the electric fields provided from the gate electrodes 7 and 8 of the MOSFETs $Q_1$ and $Q_2$. To be noted in connection with FIG. 4A is that conductive layer 13 is formed as an electric field shield for resistances $R_1$ and $R_2$ relative to MOSFETs $Q_1$ and $Q_2$ with its boundary limits succeeding the boundary limits of resistances $R_1$ and $R_2$ while portions of MOSFETs $Q_1$ and $Q_2$, such as, the sources and the drain regions 9 and 10 of MOSFETs $Q_1$ and $Q_2$, extend laterally beyond the boundary limits of conductive layer 13. As a result, the length of resistances $R_1$ and $R_2$ may be reduced while effectively maintaining their high resistance value with a corresponding reduction in the boundary limits of conductive layer 13 while retaining its field shielding effectiveness as explained further below. Even if the high resistance polycrystalline silicon resistances $R_1$ and $R_2$ decrease in the film thickness, the TET effects do not develop. Hence, stable and high resistance values can be obtained, which in turn leads to a reduction in the consumption current $I_{DDS}$.

Based on the prior arts, the high resistance polycrystalline silicon resistances $R_1$ and $R_2$ have to be 4 to 5 $\mu$m in length in order to acquire sufficient resistance values. In accordance with the embodiment of the present invention, however, the high resistance polycrystalline silicon resistances $R_1$ and $R_2$ can be reduced down to, e.g., 2 through 4 $\mu$m in length because of the incremental increase in the resistance values in combination with thinning of the high resistance polycrystalline silicon resistances $R_1$ and $R_2$. As a result, an area of the memory cell can be reduced in proportion to the above-mentioned decrease in length, thereby incrementing a density of integration.

The static RAM in this embodiment involves the use of the third interlayer insulating film 17 such as a PSG film to cover the wiring layer 15 and the high resistance polycrystalline silicon resistances $R_1$ and $R_2$. Disposed on the third interlayer insulating film 17 are data lines DL and $\overline{DL}$ each consisting of an aluminum film or an aluminum alloy film.

Incidentally, whether no or a slight amount of impurities are implanted in the high resistance polycrystalline silicon resistances $R_1$ and $R_2$ is of no importance on their exhibited condition of high resistance values.

The description will next be focused on a method of manufacturing the static RAM in the foregoing embodiment. Referring first to FIGS. 4(A) and 4(B), there are formed the MOSFETs $Q_1$ through $Q_4$, the word line WL and grounding conductor SL (a diffused region formed in the substrate in this embodiment) over which the interlayer insulating film 12 is disposed. Thereafter, a polycrystalline silicon film 18 of, e.g., 1000 Å is formed as shown in FIG. 5A. Subsequent to this step, the impurities such as phosphorus and boron are diffused; or alternatively the ion implantation with a high concentration of, e.g., $5 \times 10^{15}$ cm$^{-2}$ takes place therein. The polycrystalline silicon film 18 is thus made conductive (FIG. 5(A)).

Next, as illustrated in FIG. 5(B), the polycrystalline film 18 is subjected to patterning to assume a predetermined shape to form conductive layer 13. Note that the conductive layer 13 is arranged to be grounded or connected to a constant potential.

As shown in FIG. 5A second inter-layer insulating film 14 is formed over the surface, and a contact hole 19 is formed therein. Then, an intrinsic polycrystalline film 20 is formed on second interlayer insulating film having a relatively small thickness of approximately 500 Å.

Subsequently, as depicted in FIG. 5(C), mask layers (not shown) each composed of a resist or SiO$_2$ is disposed on portions corresponding to the high resistance polycrystalline silicon resistances, which are formed afterwards in the intrinsic polycrystalline silicon film 20. In this state, the phosphorus diffusion or the ion implantation is effected, thereby decreasing resistance values of portions of the polycrystalline silicon film 20 which are not covered with the resist mask layer. The wiring layer 15 is thus obtained.

After removing the resist mask layer, the polycrystalline silicon film 20 undergoes patterning to form a predetermined shape, with the result that the wiring layer 15 and the high resistance polycrystalline silicon resistances $R_1$ and $R_2$ are formed. In the case of the cross section point of FIG. 5C, only resistance $R_2$ is shown. Thereafter, as depicted in FIGS. 4(A) and 4(B), a third interlayer insulating film 17, a contact hole 21 and data lines DL and $\overline{DL}$ are formed to completely manufacture a desired static RAM.

This embodiment provides for the use of polycrystalline silicon as a high resistance region into which virtually no or a small amount of impurities are implanted. Instead, however, monocrystalline silicon monocrystallized by laser-annealing the polycrystalline silicon may be employed as the high resistance region.

Based on the manufacturing method discussed above, it is possible to manufacture the stable static RAM having a small consumption current $I_{DDS}$ by performing the simple processes.

Although the invention made by the present inventor has been discussed so far on the basis of the illustrative embodiments in a specific manner, it is to be understood that the present invention is not limited to those embodiments. A variety of modifications may, as a matter of course, be effected therein without departing from the gist of the invention.

For instance, it is practicable to make the wiring layer 15 conductive with a decrease in the resistance value, this entailing provision of a refractory metal film of aluminum, Mo, Ti and W instead of the polycrystalline silicon, or a refractory metal silicide film of MoSi$_2$, TiSi$_2$ and WSi$_2$.

Sources of the MOSFETs $Q_1$ and $Q_2$ are, as depicted in FIG. 6, connected via a contact 22 to the polycrystalline silicon 15 into which the impurities are implanted with a high concentration, thus providing ground conductor SL for the memory cell. In this case, the memory cell ground conductor SL which has hitherto been formed on the substrate becomes unnecessary, and hence the memory cell decreases in size enough to obtain a high density structure.

The conductive layers 13 are formed beneath the high resistance polycrystalline silicon resistances $R_1$ and $R_2$ separated therefrom by the second interlayer insulating film 14. However, the layers 13 need not necessarily be provided on all the portions under the resistances $R_1$ and $R_2$.

A second conductive layer 25 having a constant voltage is, as illustrated in FIG. 9, formed via a fourth insulating film 24 on the high resistance polycrystalline silicon resistances $R_1$ and $R_2$ to thereby undergo no influence of electric fields given from the data lines DL and $\overline{DL}$. It is therefore feasible to stabilize the resistance values more effectively.

The conductive layer 13 is, as depicted in FIG. 10, provided above the high resistance polycrystalline silicon resistance, $R_1$ and $R_2$ separated therefrom by the second interlayer insulating film 14. This arrangement also exhibits the same effects as in the case of FIG. 4B.

In accordance with the present invention, as discussed above, the conductive layer ground or connected to the constant potential source is formed beneath and/or above of the high resistance regions of the silicon resistance element, as a result, no influence from the electric field of upper or lower active elements is exerted on the silicon resistance elements. The following typical advantages are achieved.

(1) It is possible to manufacture a resistance element having stable resistance values and not be influenced by the electric fields of other elements positioned in proximity to the resistance element.

(2) A resistance element of polycrystalline silicon can be provided with a variety of resistance values without worry of influence of the electric fields of other elements positioned in proximity to the resistance element so that varying or reducing the thickness of the silicon resistance element can be achieved without concern for electric field influence.

(3) The static RAM exhibiting characteristics of a low and stable consumption current $I_{DDS}$ can be attained, and a semiconductor structure can be provided with reduced memory cell density.

I claim:

1. A semiconductor memory device formed on a semiconductor substrate to constitute a memory cell of a static memory device comprising
   first and second driver MOS transistors wherein source and drain regions for each of said first and second driver MOS transistors are formed in said substrate,
   first and second transfer MOS transistors wherein source and drain regions for each of said first and second driver MOS transistors are formed in said substrate,
   first and second load resistances,
   a first gate insulating layer formed on said substrate,
   a first conductive polycrystalline silicon layer formed on said gate insulating layer and patterned as first and second gates for said first and second driver MOS transistors and respectively connected to said first and second transfer MOS transistor source regions,
   a second insulating layer formed on said first polycrystalline silicon layer,
   a second conductive polycrystalline silicon or metal layer formed on said second insulating layer,
   a third insulating layer formed on said second conductive layer,
   a third intrinsic polycrystalline silicon layer formed on said third insulating layer, said third polycrystalline silicon layer patterned into a pair of spatially disposed, parallel polycrystalline strips with end sections of each of said strips formed into low resistance regions and wherein first ends of said end sections are connected to said transfer MOS transistor source regions and second ends of said end sections are connected to a first operating potential,
   said low resistance end sections in each of said strips defining therebetween a central section respectively comprising said first and second load resistances,
   boundary limits of said second conductive layer limited in a first direction substantially to a length of said first and second load resistance strips and in a second direction substantially to a width of both said first and second load resistance strips including spacing therebetween wherein the boundary limits of said first and second load resistance strips overlying said second conductive layer are within the boundary limits of said second conductive layer, and wherein said second conductive layer overlying said first and second driver MOS transistors does not correspond to boundary limits of said first and second driver MOS transistor in that said first and second driver MOS transistor drain and source regions extend laterally from beneath and beyond said second conductive layer boundary limits,
   said second conductive layer connected to a potential source or to ground,
   wherein said second conductive layer functioning as a shield for said first and second load resistance strips to protect said load resistance strips from effects of electric fields established from operation of said first and second driver MOS transistors, and
   wherein said second conductive layer shield permitting a corresponding thinning of thickness of said third polycrystalline silicon layer forming said first and second load resistance strips to increase their resistance value thereby permitting a reduction in the length of said strips to a range of about 2 µm to 4 µm while maintaining their necessary high resistance values in the range of about 100 GΩ to 5TΩ for operation of said memory cell so that overall size of said memory cell is reduced and total density of said static memory device is increased.

2. The semiconductor memory device of claim 1 further comprising
   a fourth insulating layer formed over said first and second parallel load resistance strips,
   a fourth conductive polycrystalline silicon or metal layer formed on said fourth insulating layer,
   boundary limits of said fourth conductive layer having substantially the same configuration as said second conductive layer,
   a fifth insulating layer formed over said fourth conductive layer,
   spatially parallel and conductive data lines formed on said fifth insulating layer,
   said fourth conductive layer overlying said first and second load resistance strips having substantially corresponding boundary limits of said first and second load resistance strips, said fourth conductive layer underlying said conductive data lines,
   said fourth conductive layer connected to a potential source or to ground and functioning as a shield to said first and second load resistance strips to protect said strips from effects of electric fields established from operation of said conductive data lines.

3. The semiconductor memory device of claim 1 wherein said first and second driver MOS transistor source regions are connected vertically through a contact hole through said first, second and third insulating layers and said first and second conductive layers to respective of said second ends of said first and second resistance load strips.

4. A semiconductor memory device formed on a semiconductor substrate to constitute a memory cell of a static memory device comprising a plurality of active and passive elements formed on said substrate, a first insulating layer formed on said active or passive elements, first and second load resistances formed on said active or passive elements, a first conductive polycrystalline silicon or metal layer formed on said first insulating layer, a second insulating layer formed on said first conductive layer, a second polycrystalline silicon layer formed on said second insulating layer, said second polycrystalline silicon layer patterned into a pair of spatially disposed polycrystalline strips with end sections of each of said strips formed into low resistance regions, said low resistance end sections in each of said strips defining therebetween a central section respectively comprising said first and second load resistances, boundary limits of said first conductive layer limited in a first direction substantially to a length of said first and second load resistance strips and in a second direction substantially to a width of both said first and second load resistance strips including spacing therebetween wherein the boundary limits of said first and second load resistance strips overlying said first conductive layer are within the boundary limits of said first conductive layer, and wherein said first conductive layer overlying any of said active or passive elements does not correspond to boundary limits of said active or passive elements underlying said first conductive layer in that portions of said underlying active or passive elements extend laterally from beneath and beyond said first conductive layer boundary limits, said first conductive layer connected to a potential source or to ground, wherein said first conductive layer functioning as a shield for said first and second load resistance strips to protect said load resistance strips from effects of electric fields established from operation of said underlying active or passive elements, and wherein said first conductive layer shield permitting a corresponding thinning of thickness of said second polycrystalline silicon layer forming said first and second load resistance strips to increase their resistance value thereby permitting a reduction in the length of said strips to a range of about 2 $\mu$m to 4 $\mu$m while maintaining their necessary high resistance values in the range of about 100 G$\Omega$ to 5T$\Omega$ for operation of said memory cell so that overall size of said memory cell is reduced and total density of said static memory device is increased.

5. The semiconductor memory device of claim 4 further comprising a third insulating layer formed over said first and second load resistance strips, a third conductive polycrystalline silicon or metal layer formed on said third insulating layer, boundary limits of said third conductive layer having substantially the same configuration as said first conductive layer, a fourth insulating layer formed over said third conductive layer, second active or passive elements formed on said fourth insulating layer, said third conductive layer overlying said first and second load resistance strips and having substantially corresponding boundary limits of said first and second load resistance strips, said third conductive layer underlying said second active or passive elements, said third conductive layer connected to a potential source or to ground and functioning as a shield to said first and second load resistance strips to protect said strips from effects of electric fields established from operation of said second active or passive elements.

* * * * *